(12) United States Patent
Wen et al.

(10) Patent No.: US 10,775,415 B2
(45) Date of Patent: Sep. 15, 2020

(54) TEST CABLE USED IN USB 3.0 TYPE C AND TEST METHOD USING THE SAME

(71) Applicant: PEGATRON CORPORATION, Taipei (TW)

(72) Inventors: Kuo-Shun Wen, Taipei (TW); Kuang-Ching Yeh, Taipei (TW); Shu-Ming Hsu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 161 days.

(21) Appl. No.: 16/013,572

(22) Filed: Jun. 20, 2018

(65) Prior Publication Data

US 2019/0025343 A1 Jan. 24, 2019

(30) Foreign Application Priority Data

Jul. 18, 2017 (TW) .............................. 106123945 A

(51) Int. Cl.
*G01R 1/24* (2006.01)
*G06F 11/22* (2006.01)

(52) U.S. Cl.
CPC .............. *G01R 1/24* (2013.01); *G06F 11/221* (2013.01)

(58) Field of Classification Search
CPC .............. G06F 13/4022; G06F 13/4068; G06F 13/4027; G06F 1/3287; G06F 11/3051; G06F 13/102; G06F 13/4059; G06F 1/325; G06F 11/2284; G06F 1/1683; G06F 1/28; G06F 1/305; G06F 21/34; G06F 2213/0042; G06F 3/0227; G06F 9/4403; G06F 11/221; G06F 13/38; H01R 24/62; H01R 31/06; H01R 13/6658; H01R 24/76; H01R 31/665; H01R 31/065; H04M 1/0254; H04M 1/0274; H04B 2203/5454; H04N 2201/0041; H04N 2201/0043; H04N 2201/0044; G01R 1/24; G01R 31/66
See application file for complete search history.

(56) References Cited

U.S. PATENT DOCUMENTS

| 7,880,475 | B2 | 2/2011 | Crumlin et al. |
|---|---|---|---|
| 9,535,117 | B2 | 1/2017 | Menon et al. |
| 9,606,953 | B2 * | 3/2017 | Talmola .............. G06F 13/4081 |
| 9,787,115 | B2 * | 10/2017 | Lin ........................... H02J 7/00 |

(Continued)

FOREIGN PATENT DOCUMENTS

| CN | 101685934 | 3/2010 |
|---|---|---|
| CN | 102695207 | 2/2015 |

(Continued)

*Primary Examiner* — Vinh P Nguyen
(74) *Attorney, Agent, or Firm* — J.C. Patents

(57) ABSTRACT

A test cable and a test method using the same are provided. The test cable includes a universal serial bus (USB) connector, a test terminal connector and a switch circuit. The USB connector is coupled to an electronic device and has a first pair of data pins and a second pair of data pins. The test terminal connector is coupled to a test fixture and has a pair of test data pins and a first control pin, and the test fixture is used for outputting a first control signal to the first control pin. The switch circuit is coupled to the first pair and second pair of data pins, the pair of test data pins and the first control pin, and couples the pair of test data pins to the first pair or second pair of data pins according to the first control signal.

29 Claims, 3 Drawing Sheets

(56) References Cited

U.S. PATENT DOCUMENTS

| | | | |
|---|---|---|---|
| 2004/0169072 A1* | 9/2004 | Peng | G06K 9/20 235/375 |
| 2014/0180618 A1* | 6/2014 | Xiong | G06F 11/2284 702/83 |
| 2018/0106834 A1* | 4/2018 | Liu | G01R 1/0416 |
| 2019/0196924 A1* | 6/2019 | Gregg | G06F 11/221 |

FOREIGN PATENT DOCUMENTS

| | | |
|---|---|---|
| CN | 105472376 | 4/2016 |
| CN | 205231376 | 5/2016 |
| CN | 206022845 | 3/2017 |
| TW | M520785 | 4/2016 |
| WO | 2016106056 | 6/2016 |

* cited by examiner

```
┌─────────────────────────────────────────────────────────────┐
│ coupling a test fixture and an electronic device through a │
│ test cable, wherein one end of the test cable is coupled to │
│ the test fixture, and the other end is coupled to the       │
│ electronic device                                           │
└─────────────────────────────────────────────────────────────┘ ~ S310
                              ↓
┌─────────────────────────────────────────────────────────────┐
│ in a test phase I (corresponding to third test phase), a    │
│ second test signal (corresponding to USB 3.0 test signal)   │
│ is provided to the test fixture from a first pair of        │
│ transmitting pins PTX1 (corresponding to pins A2 and A3)    │
│ of the USB Type-C interface of the electronic device        │
│ through the test cable, and a feedback signal is received   │
│ from a first pair of receiving pins PRX1 (corresponding to  │
│ pins B10 and B11) of the USB Type-C interface of the        │
│ electronic device to determine whether the transmitting     │
│ function of the first pair of transmitting pins PTX1 and    │
│ the first pair of receiving pins PRX1 is normal             │
└─────────────────────────────────────────────────────────────┘ ~ S320
                              ↓
┌─────────────────────────────────────────────────────────────┐
│ in a test phase II (corresponding to fourth test phase),    │
│ the second test signal (corresponding to USB 3.0 test       │
│ signal) is provided to the test fixture from a second pair  │
│ of transmitting pins PTX2 (corresponding to pins B2 and B3) │
│ of USB Type-C interface of the electronic device through    │
│ the test cable, and the feedback signal is received from a  │
│ second pair of receiving pins PRX2 (corresponding to pins   │
│ A10 and A11) of the USB Type-C interface of electronic      │
│ device to determine whether the transmitting function of    │
│ the second pair of transmitting pins PTX2 and the second    │
│ pair of receiving pins PRX2 is normal                       │
└─────────────────────────────────────────────────────────────┘ ~ S330
                              ↓
┌─────────────────────────────────────────────────────────────┐
│ in a test phase III (corresponding to first test phase),    │
│ the electronic device provides a first test signal          │
│ (corresponding to USB 2.0 test signal) to the test fixture  │
│ through a first pair of data pins PDX1 (corresponding to    │
│ pins A6 and A7) of the test cable, and the feedback signal  │
│ output by the test fixture in corresponding to the first    │
│ test signal is transmitted to the electronic device through │
│ the first pair of data pins PDX1 to determine whether the   │
│ transmitting function of the first pair of data pins PDX1   │
│ is normal                                                   │
└─────────────────────────────────────────────────────────────┘ ~ S340
                              ↓
┌─────────────────────────────────────────────────────────────┐
│ in a test phase IV (corresponding to second test phase),    │
│ the electronic device provides the first test signal        │
│ (corresponding to USB 2.0 test signal) to the test fixture  │
│ through a second pair of data pins PDX2 (corresponding to   │
│ pins B6 and B7) of the test cable, and the feedback signal  │
│ output by the test fixture in corresponding to the first    │
│ test signal is transmitted to the electronic device through │
│ the second pair of data receiving pins PDX2 to determine    │
│ whether the transmitting function of the second pair of     │
│ data pins PDX2 is normal                                    │
└─────────────────────────────────────────────────────────────┘ ~ S350
```

FIG. 3

TEST CABLE USED IN USB 3.0 TYPE C AND TEST METHOD USING THE SAME

CROSS-REFERENCE TO RELATED APPLICATION

This application claims the priority benefit of Taiwan application serial no. 106123945, filed on Jul. 18, 2017. The entirety of the above-mentioned patent application is hereby incorporated by reference herein and made a part of this specification.

BACKGROUND

Field of the Invention

The invention is related to a test cable, and particularly to a test cable used in universal serial bus (USB) 3.0 Type C interface and a test method using the test cable.

Related Art

Universal serial bus (USB) interface has been commonly used in electronic devices such as smart phone, digital camera, tablet PC, notebook computer and so on. The USB interface not only can be used for transmitting data, but also can be used for power transmission. Since the USB interface has been developed quickly and used widely, USB 3.0 Type C interface that can be inserted in a reversible manner has been proposed. However, since the USB 3.0 Type C interface serves the function of reversible connection, it becomes difficult to carry out interface test. Accordingly, it is an issue in the test system field to explore how to design a system that can completely test the USB 3.0 Type C interface on electronic device without replugging.

SUMMARY

The invention provides a test cable and a test method using the same, which make it possible to provide a test signal to pins to be tested in sequence without replugging, thereby reducing test cost.

In the invention, a test cable includes a universal serial bus (USB) connector, a test terminal connector and a switch circuit. The USB connector is coupled to an electronic device and has a first pair of data pins and a second pair of data pins. The test terminal connector is coupled to a test fixture and has a pair of test data pins and a first control pin. The test fixture is configured to output a first control signal to the first control pin. The switch circuit is coupled to the first pair of data pins, the second pair of data pins, the pair of test data pins and the first control pin, and couples the pair of test data pins to the first pair of data pins or the second pair of data pins according to the first control signal.

In the invention, a test method includes the following steps. A test fixture and an electronic device are coupled together through a test cable as described above. In a first test phase, a pair of test data pins is coupled to a first pair of data pins according to a first control signal. The electronic device provides a first test signal to the test fixture through the first pair of data pins of the test cable, and receives a first feedback signal output by the test fixture in corresponding to the first test signal through the first pair of data pins. The first test signal and the first feedback signal are compared to determine whether they are the same or different to determine whether the first pair of data pins is normal. In a second test phase, the first control signal is set to couple the pair of test data pins to the second pair of data pins. The electronic device provides the first test signal to the test fixture through the second pair of data pins of the test cable, and receives a second feedback signal output by the test fixture in corresponding to the first test signal through the second pair of data pins. The first test signal and the second feedback signal are compared to determine whether they are the same or different to determine whether the second pair of data pins is normal.

In summary, according to the embodiments of the invention, in the configuration of the test cable and the test method using the same for coupling a test fixture to an electronic device, the test cable has the switch circuit such that the test signal can be transmitted to the test fixture in sequence through the pair of pins of the USB connectors on different sides. Also, the test fixture can transmit the feedback signal corresponding to the test signal to the electronic device through the pair of data pins of the USB connectors on different sides. The test signal and the feedback signal are compared to determine whether they are the same or different to determine whether the pair of pins is normal. In this manner, all of data interfaces in the USB interface can be tested without replugging, thereby reducing the difficulty of test.

In order to make the aforementioned features and advantages of the invention more comprehensible, embodiments accompanying figures are described in detail below.

BRIEF DESCRIPTION OF THE DRAWINGS

FIG. 3 is a flowchart diagram of a test method testing an electronic device according to an embodiment of the invention.

DETAILED DESCRIPTION OF THE EMBODIMENTS

Figure 1:
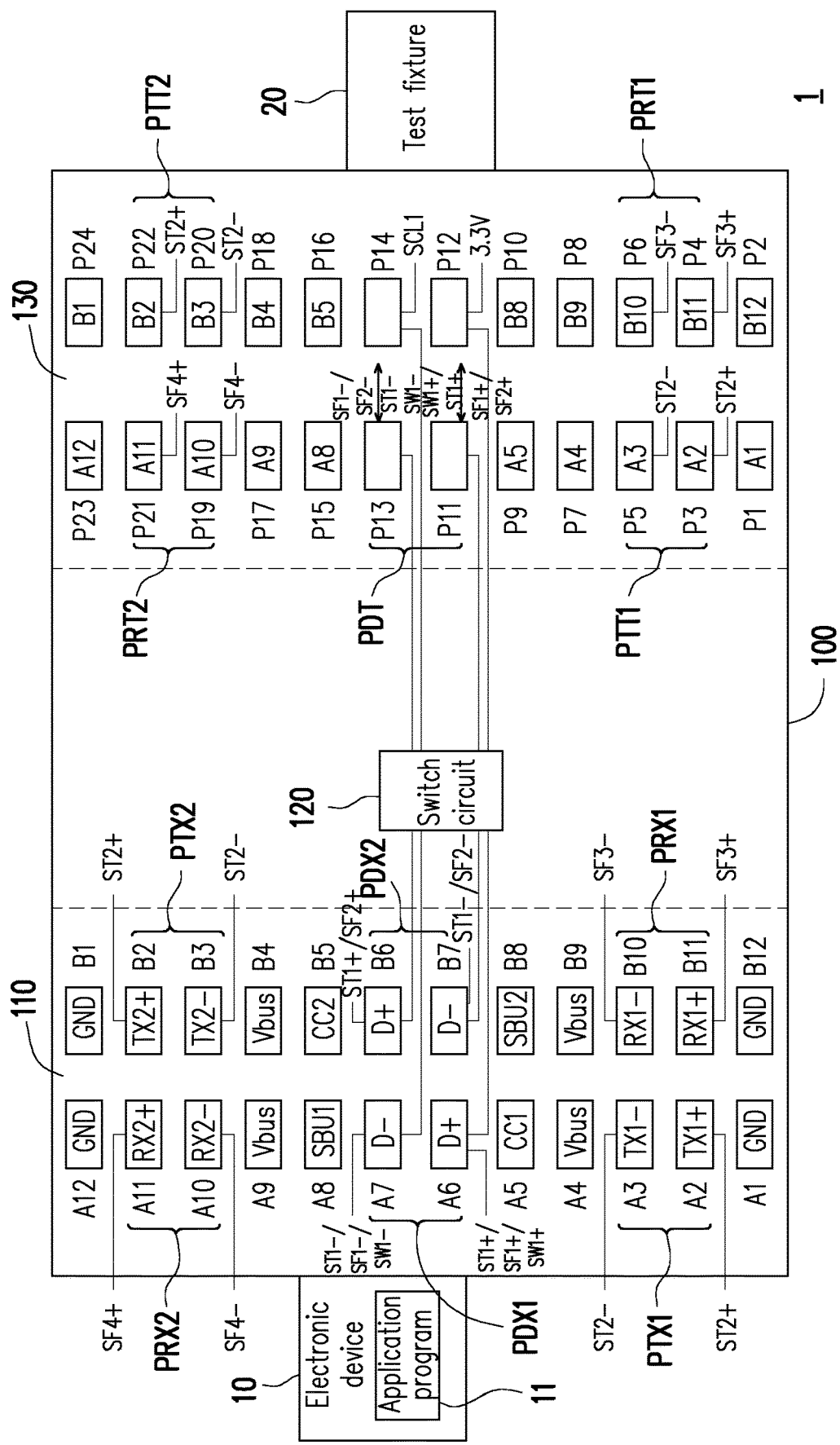
FIG. 1 is a system schematic diagram illustrating a test system according to an embodiment of the invention.

FIG. 1 is a system schematic diagram illustrating a test system according to an embodiment of the invention. Referring to FIG. 1, in the embodiment, a test system 1 includes an electronic device 10, a test cable 100 and a test fixture 20. The test cable 100 is configured to couple the electronic device 10 and the test fixture 20, and includes a universal serial bus (USB) connector 110, a switch circuit 120 and a test terminal connector 130, wherein the electronic device 10 herein is a target to be tested, and the USB connector 110 herein is exemplified as a USB Type C connector.

The USB connector 110 is coupled to a USB connector base (not shown) of the electronic device 10, and in compliance with USB Type-C standard, the USB connector 110 has 24 pins, namely A1-A12 and B1-B12, and the functions (i.e., text shown in blocks) of the pins in the USB connector 110 are described in the USB Type-C standard. Herein, only related pins are described in order to simplify the length of specification. Specifically, the 24 pins of the USB connector 110 and the 24 pins of the USB connector base of the electronic device 10 are directly coupled together; that is, the function of the 24 pins of the USB connector base is the same as the function of the 24 pins in the USB connector 110.

Furthermore, the USB connector 110 has a USB 2.0 data interface and a USB 3.0 data interface, wherein the USB 2.0 data interface includes a first pair of data pins PDX1 formed by pins A7 and A6 and a second pair of data pins PDX2 formed by pins B7 and B6. The USB 3.0 data interface includes a first pair of transmitting pins PTX1 formed by pins A2 and A3, a first pair of receiving pins PRX1 formed by pins B10 and B11, a second pair of transmitting pins PTX2 formed by pins B2 and B3 and a second pair of receiving pins PRX2 formed by pins A10 and A11.

The switch circuit 120 is coupled to the first pair of data pins PDX1 and the second pair of data pins PDX2. The test terminal connector 130 is coupled to the test fixture 20. Herein, the test terminal connector 130 is exemplified as a pogo-pin type connector (i.e., pins P1-P24) having 24 pins, wherein the 24 pins of the test terminal connector 130 are directly coupled to the USB connector base (not shown) of the test fixture 20. In other words, the 24 pins of the test terminal connector 130 and the 24 pins of the USB connector base are directly coupled together; that is, the function of the 24 pins of the USB connector base is the same as the function of the 24 pins of the test terminal connector 130. Specifically, the pins P11, P12, P13 and P14 of the test terminal connector 130 are directly coupled to the switch circuit 120, and the rest of pins are directly coupled to corresponding pins (as denoted by the reference numerals shown in blocks) in the USB connector 110.

Herein, pins P3 and P5 are formed as a pair of transmitting test pins PTT1 (corresponding to first pair of transmitting test pins), pins P4 and P6 are formed as a pair of receiving test pins PRT1 (corresponding to first pair of receiving test pins), pins P20 and P22 are formed as a pair of transmitting test pins PTT2 (corresponding to second pair of transmitting test pins), and pins P19 and P21 are formed as a pair of receiving test pins PRT2 (corresponding to second receiving test pins). Additionally, pins P11 and P13 are formed as a pair of test data pins PDT, and the pins P11 and P13 are coupled to the test fixture 20 to respectively transmit test signals ST1+ and ST1−, wherein the test signal ST1+ and ST1− are configured to form a differential signal (i.e., first test signal).

Moreover, the pin P12 (corresponding to switch power pin) is coupled to the test fixture 20 to receive and transmit an operation voltage (exemplified as 3.3V) to the switch circuit 120. The pin P14 (corresponding to first control pin) is coupled to the test fixture 20 to receive a first control signal SCL1 provided by the test fixture 20 to the switch circuit 120. Moreover, the pins P3, P5, P20 and P22 are coupled to the test fixture 20 to respectively transmit test signals ST2+ and ST2−, wherein the test signals ST2+ and ST2− are configured to form a differential signal (i.e., second test signal).

In the embodiment, in the case of the USB 2.0 data interface, the switch circuit 120 couples the pair of test data pins PDT to the first pair of data pins PDX1 or the second pair of data pins PDX2 according to the first control signal SCL1. For example, when the first control signal SCL1 is a first logic level (e.g., "H"), the pin P11 of the pair of test data pins PDT is coupled to the pin A6 of the first pair of data pins PDX1, the pin P13 of the pair of test data pins PDT is coupled to the pin A7 of the first pair of data pins PDX1. When the first control signal SCL1 is a second logic level (e.g., "L"), the pin P11 of the pair of test data pins PDT is coupled to the pin B6 of the second pair of data pins PDX2, and the pin P13 of the pair of test data pins PDT is coupled to the pin B7 of the second pair of data pins PDX2.

TABLE 1

|     | ST1+/ST1− | ST2+/ST2− | SCL1 |
|-----|-----------|-----------|------|
| I   | X         | A2/A3     | H    |
| II  | X         | B2/B3     | H    |
| III | A6/A7     | X         | H    |
| IV  | B6/B7     | X         | L    |

Table 1 shows four test phases (represented by I-IV) of a test system 1. In the embodiment, the electronic device 10 may execute an application program 11 to perform test on the USB interface, that is, to instruct the test fixture 20 to set the first control signal SCL1 and receive the test signals ST1+, ST1−, ST2+ and ST2−.

Referring to Table 1, in the test phase I (corresponding to a third test phase), the electronic device 10 provides the test signals ST2+ and ST2− to the first pair of transmitting pins PTX1, and the first pair of transmitting pins PTX1 is directly coupled to the pair of transmitting test pins PTT1 through wire to transmit the test signals ST2+ and ST2− to the test fixture 20 through the pair of transmitting test pins PTT1. When the test fixture 20 receives the test signals ST2+ and ST2−, feedback signals SF3+ and SF3− are formed and transmitted to the pair of receiving test pins PRT1, and the pair of receiving test pins PRT1 is directly coupled to the first pair of receiving pins PRX1 through wire, that is, the feedback signals SF3+ and SF3− are transmitted to the electronic device 10 through the pair of receiving test pins PRT1 and the first pair of receiving pins PRX1, wherein the feedback signals SF3+ and SF3− are configured to form a differential signal (i.e., third feedback signal).

Based on the above, the test signals ST2+ and ST2− and the feedback signals SF3+ and SF3− should be the same signal, that is, the content transmitted by the test signals ST2+ and ST2− should be the same as the content transmitted by the feedback signals SF3+ and SF3−, and the application program 11 may compare whether the test signals ST2+ and ST2− are the same as the feedback signals SF3+ and SF3−. In other words, when the feedback signals SF3+ and SF3− are the same as the test signals ST2+ and ST2−, the application program 11 may determine that the first pair of transmitting pins PTX1 and the first pair of receiving pins PRX1 are normal. When the feedback signals SF3+ and SF3− are different from the test signals ST2+ and ST2−, the application program 11 may determine that the first pair of transmitting pins PTX1 and the first pair of receiving pins PRX1 are abnormal.

Specifically, whether the signals are the same or different may be determined based on the comparison of the overall signal, or based on the comparison of the content acquired from the decoded signal, which may be decided depending on persons skilled in the art, and the embodiments of the invention provide no limitation thereto.

Next, in test phase II (corresponding to a fourth test phase), the electronic device 10 provides the test signals ST2+ and ST2− to the second pair of transmitting pins PTX2, and the second pair of transmitting pins PTX2 is directly coupled to the pair of transmitting test pins PTT2 through wire to transmit the test signals ST2+ and ST2− to the test fixture 20 through the pair of transmitting test pins PTT2. When the test fixture 20 receives the test signals ST2+ and ST2− again, feedback signals SF4+ and SF4− are formed and transmitted to the pair of receiving test pins PRT2, and the pair of receiving test pins PRT2 is directly coupled to the second pair of receiving pins PRX2 through wire; that is, the feedback signals SF4+ and SF4− are transmitted to the electronic device 10 through the pair of receiving test pins PRT2 and the second pair of receiving pins PRX2, wherein the feedback signals SF4+ and SF4− are configured to form a differential signal (i.e., fourth feedback signal).

Therefore, the application program 11 may compare the test signals ST2+ and ST2− with the feedback signals SF4+ and SF4− to determine whether they are the same or different. Moreover, when the feedback signals SF4+ and SF4− are the same as the test signals ST2+ and ST2−, the application program 11 may determine that the second pair of transmitting pins PTX2 and the second pair of receiving pins PRX2 are normal. When the feedback signals SF4+ and SF4− are different from the test signals ST2+ and ST2−, the application program 11 may determine that the second pair of transmitting pins PTX2 and the second pair of receiving pins PRX2 are abnormal.

Thereafter, in test phase III (corresponding to a first test phase), the first control signal SCL1 is preset as the first logic level "H", and the electronic device 10 provides the test signals ST1+ and ST1− to the first pair of data pins PDX1. At this time, the pair of test data pins PDT is coupled to the first pair of data pins PDX1 through the switch circuit 120, that is, the test signals ST1+ and ST1− are transmitted to the test fixture 20 through the first pair of data pins PDX1, the switch circuit 120 and the pair of test data pins PDT. When the test fixture 20 receives the test signals ST1+ and ST1−, the feedback signals SF1+ and SF1− are formed and transmitted to the pair of test data pins PDT, that is, the feedback signals SF1+ and SF1− are transmitted to the electronic device 10 through the pair of test data pins PDT, the switch circuit 120 and the first pair of data pins PDX1, wherein the feedback signals SF1+ and SF1 are configured to form a differential signal (i.e., first feedback signal).

Therefore, the application program 11 may compare the test signals ST1+ and ST1− with the feedback signals SF1+ and SF1− to determine whether they are the same or different. Moreover, when the feedback signals SF1+ and SF1− are the same as the test signals ST1+ and ST1−, the application program 11 may determine that the first pair of data pins PDX1 is normal. When the feedback signals SF1+ and SF1− are different from the test signals ST1+ and ST1, the application program 11 may determine that the first pair of data pines PDX1 is abnormal. Meanwhile, when the first pair of data pins PDX1 is normal, the electronic device 10 transmits switching signals SW1+ and SW1− to the test fixture 20 through the first pair of data pins PDX1, the switch circuit 120 and the pair of test data pins PDT. Then the test fixture 20 sets the first control signal SCL1 as the second logic level "L", and test phase IV (corresponding to a second test phase) is performed. When the first pair of data pins PDX1 is abnormal, it may be shown that the test is abnormal, and the test process is interrupted, that is, the test phase IV is not performed. Specifically, the switching signals SW1+ and SW1− are configured to form a differential signal (i.e., first switching signal).

Lastly, in the test phase IV, the electronic device 10 provides the test signals ST1+ and ST1− to the second pair of data pins PDX2. At this time, the pair of test data pins PDT are coupled to the second pair of data pins PDX2 through the switch circuit 120, that is, the test signals ST1+ and ST1− are transmitted to the test fixture 20 through the second pair of data pins PDX2, the switch circuit 120 and the pair of test data pins PDT. When the test fixture 20 receives the test signals ST1+ and ST1− again, the feedback signals SF2+ and SF2− are formed and transmitted to the pair of test data pins PDT, that is, the feedback signals SF2+ and SF2− are transmitted to the electronic device 10 through the pair of test data pins PDT, the switch circuit 120 and the second pair of data pins PDX2, wherein the feedback signals SF2+ and SF2− are configured to form a differential signal (i.e., second feedback signal).

Accordingly, the application program 11 may compare the test signals ST1+ and ST1− with the feedback signals SF2+ and SF2− to determine whether they are the same or different. Meanwhile, when the feedback signals SF2+ and SF2− are the same as the test signals ST1+ and ST1−, the application program 11 may determine that the second pair of data pins PDX2 is normal. When the feedback signals SF2+ and SF2− are different from the test signals ST1+ and ST1−, the application program 11 may determine that the second pair of data pins PDX2 is abnormal.

Based on the above, in different test phases, the application program 11 may determine whether the first pair of transmitting pins PTX1, the first pair of receiving pins PRX1, the second pair of transmitting pins PTX2 and the second pair of receiving pins PRX2 are normal by comparing the test signals ST2+ and ST2− with the feedback signals SF3+, SF3−, SF4+ and SF4−. Also, the application program 11 may determine whether the first pair of data pins PDX1 and the second pair of data pins PDX2 are normal by comparing the test signals ST1+ and ST1− with the feedback signals SF1+, SF1−, SF2+ and SF2−. In this manner, the test signals ST1+, ST1−, ST2+ and ST2− are transmitted to all the data interfaces in the USB interface of the electronic device 10 through the test cable 100 without replugging, thereby reducing the difficulty of test.

In the embodiment, the first control signal SCL1 is preset as the first logic level "H", which should not be construed as a limitation to the invention. Meanwhile, the order of performing the test phase I and the test phase II may be switched, and the order of performing the test phase III and the test phase IV may be switched, but the test phase I and the test phase II are prior to the test phase III and the test phase IV.

Additionally, the test signals ST1+ and ST1− include a plurality of data packets transmitted through a plurality of communication protocols, wherein the communication protocols and the data packets are in compliance with a USB 2.0 standard, and the plurality of data packets transmitted through the same communication protocol (i.e., one of the communication protocols) have different packet format. Likewise, the test signals ST2+ and ST2− include a plurality of data packets transmitted through a plurality of communication protocols, wherein the communication protocols and the data packets are in compliance with a USB 3.0 standard, and the plurality of data packets transmitted through the same communication protocol (i.e., one of the communication protocols) have different packet formats.

Figure 2:
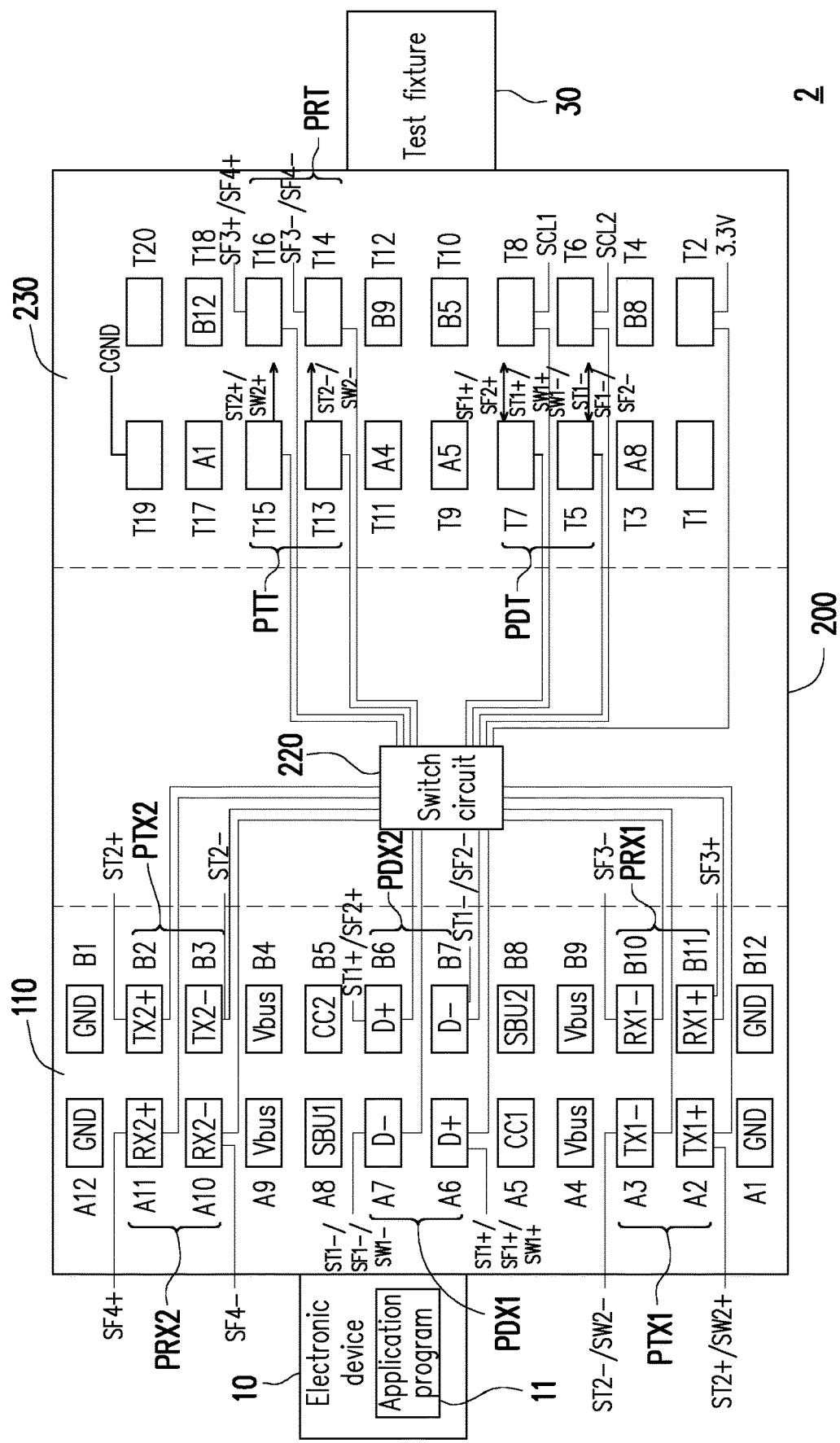
FIG. 2 is a system schematic diagram illustrating a test system according to another embodiment of the invention.

FIG. 2 is a system schematic diagram illustrating a test system according to another embodiment of the invention. Referring to FIG. 1 and FIG. 2, in the embodiment, a test system 2 is substantially the same as the test system 1, and the difference between the two lies in a test cable 200 and a test fixture 30, wherein the same or similar elements are denoted by the same or similar reference numerals.

In the embodiment, a switch circuit 220 of the test cable 200 is coupled to the first pair of data pins PDX1, the second pair of data pins PDX2, the first pair of transmitting pins PTX1, the first pair of receiving pins PRX1, the second pair of transmitting pins PTX2 and the second pair of receiving pins PRX2.

A test terminal connector 230 of the test cable 200 is coupled to the test fixture 30. Herein, the test terminal connector 230 is exemplified as a pogo-pin type connector (i.e., pins T1-T20) having 20 pins, wherein the 20 pins of the test terminal connector 230 are directly coupled to the test fixture 30, pins T2, T5-T8 and T13-T16 are directly coupled to the switch circuit 220, and pins T3, T4, T9-T12, T17 and T18 are directly coupled to the corresponding pins (as denoted by the reference numerals shown in blocks) in the USB connector 110, a pin T19 receives a common ground voltage CGND from the test fixture 30.

Herein, the pins T5 and T7 are formed as the pair of test data pins PDT, and the pins T5 and T7 are coupled to the test fixture 30 to respectively transmit the test signals ST1+ and ST1−. The pins T13 and T15 are formed as the pair of transmitting test pins PTT, the pins T14 and T16 are formed as the pair of receiving test pins PRT, and the pins T13 and T15 are coupled to the test fixture 30 to respectively transmit the test signals ST2+ and ST2−.

Moreover, the pin T2 (corresponding to switch power pin) is coupled to the test fixture 30 to receive and transmit an operation voltage (exemplified as 3.3V) to the switch circuit 220. The pin T8 (corresponding to first control pin) is coupled to the test fixture 30 to receive the first control signal SCL1 provided by the test fixture 30 to the switch circuit 220. The pin T6 (corresponding to second control pin) is coupled to the test fixture 30 to receive the second control signal SCL2 provided by the test fixture 30 to the switch circuit 220.

In the embodiment, in the case of the USB 2.0 data interface, the switch circuit 220 couples the pair of test data pins PDT to the first pair of data pins PDX1 or the second pair of data pins PDX2 according to the first control signal SCL1. For example, when the first control signal SCL1 is the first logic level (e.g., "H"), the pin T7 of the pair of test data pins PDT is coupled to the pin A6 of the first pair of data pins PDX1, and the pin T5 of the pair of test data pins PDT is coupled to the pin A7 of the first pair of data pins PDX1. When the first control signal SCL1 is the second logic level (e.g., "L"), the pin T7 of the pair of test data pins PDT is coupled to the pin B6 of the second pair of data pins PDX2, and the pin T5 of the pair of test data pins PDT is coupled to the pin B7 of the second pair of data pins PDX2.

In the case of the USB 3.0 data interface, the switch circuit 220 couples the pair of transmitting test pins PTT to the first pair of transmitting pins PTX1 or the second pair of transmitting pins PTX2 according to the second control signal SCL2, and simultaneously couples the pair of receiving test pins PRT to the first pair of receiving pins PRX1 or the second pair of receiving pins PRX2. For example, when the second control signal SCL2 is the first logic level (e.g., "H"), the pin T15 of the pair of transmitting test pins PTT is coupled to the pin A2 of the first pair of transmitting pins PTX1, the pin T13 of the pair of transmitting test pins PTT is coupled to the pin A3 of the first pair of transmitting pins PTX1, the pin T16 of the pair of receiving test pins PRT is coupled to the pin B11 of the first pair of receiving pins RPX1, and the pin T14 of the pair of receiving test pins PRT is coupled to the pin B10 of the first pair of receiving pins PRX1. When the second control signal SCL2 is the second logic level (e.g., "L"), the pin T15 of the pair of transmitting test pins PTT is coupled to the pin B2 of the second pair of transmitting pins PTX2, the pin T13 of the transmitting test pins PTT is coupled to the pin B3 of the second pair of transmitting pins PTX2, the pin T16 of the pair of receiving test pins PRT is coupled to the pin A11 of the second pair of receiving pins PRX2, and the pin T14 of the pair of receiving test pins PRT is coupled to the pin A10 of the second pair of receiving pins PRX2.

TABLE 2

|  | ST1+/ST1− | ST2+/ST2− | SCL1 | SCL2 |
|---|---|---|---|---|
| I | X | A2/A3 | H | H |
| II | X | B2/B3 | H | L |
| III | A6/A7 | X | H | L |
| IV | B6/B7 | X | L | L |

Table 2 shows four test phases (also represented by I-IV for easy comparison with reference to the above-mentioned embodiments) of the test system 2. In the embodiment, the electronic device 10 may execute the application program 11 to perform test on USB interface, that is, to instruct the test fixture 30 to set the first control signal SCL1 and the second control signal SCL2 and receive the test signals ST1+, ST1−, ST2+ and ST2−.

Referring to Table 2, in the test phase I (corresponding to third test phase), the second control signal SCL2 is preset as the first logic level "H", and the electronic device 10 provides the test signals ST2+ and ST2− to the first pair of transmitting pins PTX1. At this time, the pair of transmitting test pins PTT are coupled to first pair of transmitting pins PTX1 through the switch circuit 220, and the pair of receiving test pins PRT is coupled to the first pair of receiving pins PRX1 through the switch circuit 220. The test signals ST2+ and ST2− are transmitted to the test fixture 30 through the first pair of transmitting pins PTX1, the switch circuit 220 and the pair of transmitting test pins PTT. When the test fixture 30 receives the test signals ST2+ and ST2−, the feedback signals SF3+ and SF3− are formed and transmitted to the pair of receiving test pins PRT, and the feedback signals SF3+ and SF3− received by the pair of receiving test pins PRT and provided by the test fixture 30 are transmitted to the electronic device 10 through the switch circuit 220 and the first pair of receiving pins PRX1. The application program 11 may compare the test signals ST2+ and ST2− with the feedback signals SF3+ and SF3− to determine whether they are the same or different, thereby determining whether the first pair of transmitting pins PTX1 and the first pair of receiving pins PRX1 are normal.

When the first pair of transmitting pins PTX1 and the first pair of receiving pins PRX1 are normal, the electronic device 10 transmits switching signals SW2+ and SW2− to the test fixture 30 through the first pair of transmitting pins PTX1, the switch circuit 220 and the pair of transmitting test pins PTT; then, the test fixture 30 sets the second control signal SCL2 as the second logic level "L", and the test phase II (corresponding to fourth test phase) is performed. When the first pair of transmitting pins PTX1 and the first pair of receiving pins PRX1 are abnormal, it may be shown that the test is abnormal, and the test process is interrupted, that is, the test phase II is not performed. Meanwhile, the switching signals SW2+ and SW2− are configured to form a differential signal (i.e., second switching signal).

Thereafter, in the test phase II, the electronic device 10 provides the test signals ST2+ and ST2− to the second pair of transmitting pins PTX2. At this time, the pair of transmitting test pins PTT is coupled to the second pair of transmitting pins PTX2 through the switch circuit 220, the pair of receiving test pins PRT is coupled to the second pair of receiving pins PRX2 through the switch circuit 220. The test signals ST2+ and ST2− are transmitted to the test fixture 30 through the second pair of transmitting pins PTX2, the switch circuit 220 and the pair of transmitting test pins PTT. When the test fixture 30 receives the test signals ST2+ and ST2−, the feedback signals SF4+ and SF4− are formed and transmitted to the pair of receiving test pins PRT, and the feedback signals SF4+ and SF4− received by the pair of receiving test pins PRT and provided by the test fixture 30 are transmitted to the electronic device 10 through the switch circuit 220 and the second pair of receding pins PRX2. The application program 11 may compare the test signals ST2+ and ST2− with the feedback signals SF4+ and SF4− to determine whether they are the same or different, thereby determining whether the second pair of transmitting pins PTX2 and the second pair of receiving pins PRX2 are normal.

Thereafter, in test phase III (corresponding to first test phase), the first control signal SCL1 is preset as the first logic level "H", and the electronic device 10 provides the test signals ST1+ and ST1− to the first pair of data pins PDX1. At this time, the pair of test data pins PDT is coupled to the first pair of data pins PDX1 through the switch circuit 220, that is, the test signals ST1+ and ST1− are transmitted to the test fixture 30 through the first pair of data pins PDX1, the switch circuit 220 and the pair of test data pins PDT. When the test fixture 30 receives the test signals ST1+ and ST1−, the feedback signals SF1+ and SF1− are formed and transmitted to the pair of test data pins PDT, and the feedback signals SF1+ and SF1− received by the pair of test data pins PDT and provided by the test fixture 30 are transmitted to the electronic device 10 through the switch circuit 220 and the first pair of data pins PDX1. The application program 11 may compare the test signals ST1+ and ST1 with the feedback signals SF1+ and SF1− to determine whether they are the same or different, thereby determining whether the first pair of data pins PDX1 is normal.

When the first pair of data pins PDX1 is normal, the electronic device 10 transmits the switching signals SW1+ and SW1− (i.e., first switching signal) to the test fixture 30 through the first pair of data pins PDX1, the switch circuit 220 and the pair of test data pins PDT. Then, the test fixture 30 sets the first control signal SCL1 as the second logic level "L", and the test phase IV (corresponding to second test phase) is performed. When the first pair of data pins PDX1 is abnormal, it may be shown that the test is abnormal, and the test process is interrupted, that is, the test phase IV is not performed.

Lastly, in the test phase IV, the electronic device 10 provides the test signals ST1+ and ST1− to the second pair of data pins PDX2. At this time, the pair of test data pins PDT is coupled to the second pair of data pins PDX2 through the switch circuit 220, that is, the test signals ST1+ and ST1− are transmitted to the test fixture 30 through the second pair of data pins PDX2, the switch circuit 220 and the pair of test data pins PDT. When the test fixture 30 receives the test signals ST1+ and ST1−, the feedback signals SF2+ and SF2− are formed and transmitted to the pair of test data pins PDT, and the feedback signals SF2+ and SF2− received by the pair of test data pins PDT and provided by the test fixture 30 are transmitted to the electronic device 10 through the switch circuit 220 and the second pair of data pins PDX2. The application program 11 may compare the test signals ST1+ and ST1− with the feedback signals SF2+ and SF2− to determine whether they are the same or different, thereby determining whether the second pair of data pins PDX2 is normal.

In the embodiment, the first control signal SCL1 and the second control signal SCL2 are preset as the first logic level "H", which should not be construed as a limitation to the invention.

FIG. 3 is a flowchart diagram of a test method testing an electronic device according to an embodiment of the invention. Referring to FIG. 3, in the embodiment, the test method includes the following steps. In step S310, the test fixture and the electronic device are coupled together through the test cable, wherein one end of the test cable is coupled to the test fixture, and the other end is coupled to the electronic device. In step S320, in the test phase I (corresponding to third test phase), the second test signal (corresponding to USB 3.0 test signal) is provided to the test fixture from the first pair of transmitting pins PTX1 (corresponding to pins A2 and A3) of the USB Type-C interface of the electronic device through the test cable, and the feedback signal is received from the first pair of receiving pins PRX1 (corresponding to pins B10 and B11) of the USB Type-C interface of the electronic device to determine whether the transmitting function of the first pair of transmitting pins PTX1 and the first pair of receiving pins PRX1 is normal.

In step S330, in the test phase II (corresponding to fourth test phase), the second test signal (corresponding to USB 3.0 test signal) is provided to the test fixture from the second pair of transmitting pins PTX2 (corresponding to pins B2 and B3) of USB Type-C interface of the electronic device through the test cable, and the feedback signal is received from the second pair of receiving pins PRX2 (corresponding to pins A10 and A11) of the USB Type-C interface of electronic device to determine whether the transmitting function of the second pair of transmitting pins PTX2 and the second pair of receiving pins PRX2 is normal.

In step S340, in the test phase III (corresponding to first test phase), the electronic device provides the first test signal (corresponding to USB 2.0 test signal) to the test fixture through the first pair of data pins PDX1 (corresponding to pins A6 and A7) of the test cable, and the feedback signal output by the test fixture in corresponding to the first test signal is transmitted to the electronic device through the first pair of data pins PDX1 to determine whether the transmitting function of the first pair of data pins PDX1 is normal.

In step S350, in the test phase IV (corresponding to second test phase), the electronic device provides the first test signal (corresponding to USB 2.0 test signal) to the test fixture through the second pair of data pins PDX2 (corresponding to pins B6 and B7) of the test cable, and the feedback signal output by the test fixture in corresponding to the first test signal is transmitted to the electronic device through the second pair of data receiving pins PDX2 to determine whether the transmitting function of the second pair of data pins PDX2 is normal.

Specifically, the order of the steps S310, S320, S330, S340 and S350 is used and interpreted in a descriptive sense only and not for purpose of limitation. Besides, the embodiments of FIG. 1 and FIG. 2 may serve as reference for the details of steps S310, S320, S330, S340 and S350, and thus no repetitions are incorporated herein.

In summary, in the configuration of the test cable and the test method using the same described in the embodiments of the invention, the test cable has the switch circuit such that the test signal may be transmitted to the test fixture in sequence through the pair of data pins of USB connectors on different sides. In this manner, all the data interfaces in the USB interface can be tested without replugging, thereby reducing the difficulty of test.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A test cable, comprising:
   a universal serial bus (USB) connector, having a first pair of data pins and a second pair of data pins, wherein the first pair of data pins and the second pair of data pins are coupled to an electronic device;
   a test terminal connector, having a pair of test data pins and a first control pin, the pair of test data pins and the first control pin are coupled to a test fixture, and the first control pin receives a first control signal from the test fixture; and
   a switch circuit, coupled to the first pair of data pins, the second pair of data pins, the pair of test data pins and the first control pin, and the switch circuit coupling the pair of test data pins to the first pair of data pins in a first test phase and coupling the pair of test data pins to the second pair of data pins in a second test phase different from the first test phase according to the first control signal.

2. The test cable according to claim 1, wherein in the first test phase, the pair of test data pins is coupled to the first pair of data pins according to the first control signal, the electronic device provides a first test signal transmitted to the test fixture through the first pair of data pins and the pair of test data pins, and the electronic device receives a first feedback signal outputted by the test fixture in corresponding to the first test signal through the first pair of data pins and the pair of test data pins, the first test signal and the first feedback signal are compared to determine whether they are the same or different, thereby determining whether the first pair of data pins is normal, in the second test phase, the first control signal is set to couple the pair of test data pins to the second pair of data pins, the electronic device provides the first test signal transmitted to the test fixture through the second pair of data pins and the pair of test data pins, and the electronic device receives a second feedback signal outputted by the test fixture in corresponding to the first test signal through the second pair of data pins and the pair of test data pins, the first test signal and the second feedback signal are compared to determine whether they are the same or different, thereby determining whether the second pair of data pins is normal.

3. The test cable according to claim 2, wherein when it is determined that the first pair of data pins is normal, the electronic device provides a first switching signal transmitted to the test fixture through the first pair of data pins to set the first control signal.

4. The test cable according to claim 2, wherein when the first feedback signal is the same as the first test signal, it is determined that the first pair of data pins is normal, when the first feedback signal is different from the first test signal, it is determined that the first pair of data pins is abnormal, when the second feedback signal is the same as the first test signal, it is determined that the second pair of data pins is normal, and when the second feedback signal is different from the first test signal, it is determined that the second pair of data pins is abnormal.

5. The test cable according to claim 1, wherein the first pair of data pins and the second pair of data pins are respectively a USB 2.0 data interface.

6. The test cable according to claim 1, wherein the USB connector further has a first pair of transmitting pins, a second pair of transmitting pins, a first pair of receiving pins and a second pair of receiving pins, the test terminal connector further has a pair of transmitting test pins, a pair of receiving test pins and a second control pin, the switch circuit is further coupled to the first pair of transmitting pins, the second pair of transmitting pins, the first pair of receiving pins and the second pair of receiving pins, the pair of transmitting test pins, the pair of receiving test pins and the second control pin, the test fixture is configured to output a second control signal to the second control pin, and the switch circuit couples the transmitting test pins to the first pair of transmitting pins or the second pair of transmitting pins according to the second control signal and simultaneously couples the pair of receiving test pins to the first pair of receiving pins or the second pair of receiving pins.

7. The test cable according to claim 6, wherein in a third test phase, the pair of transmitting test pins is coupled to the first pair of transmitting pins according to the second control signal and the pair of receiving test pins is simultaneously coupled to the first pair of receiving pins, the electronic device provides a second test signal transmitted to the test fixture through the first pair of transmitting pins and the pair of transmitting test pins, and the electronic device receives a third feedback signal output by the test fixture in corresponding to the second test signal through first pair of receiving pins and the pair of receiving test pins, the second test signal and the third feedback signal are compared to determine whether they are the same or different, thereby determining whether the first pair of transmitting pins and the first pair of receiving pins are normal, in a fourth test phase, the second control signal is set to couple the pair of transmitting test pins to the second pair of transmitting pins and to simultaneously couple the pair of receiving test pins to the second pair of receiving pins, the electronic device provides the second test signal transmitted to the test fixture through the second pair of transmitting pins and the pair of transmitting test pins, and the electronic device receives a fourth feedback signal output by the test fixture in corresponding to the second test signal through the second pair of receiving pins and the pair of receiving test pins, the second test signal and the fourth feedback signal are compared to determine whether they are the same or different, thereby determining whether the second pair of transmitting pins and the second pair of receiving pins are normal.

8. The test cable according to claim 7, wherein when it is determined that the first pair of transmitting pins and the first pair of receiving pins are normal, the electronic device provides a second switching signal transmitted to the test fixture through the first pair of transmitting pins to set the second control signal.

9. The test cable according to claim 7, wherein when the third feedback signal is the same as the second test signal, it is determined that the first pair of transmitting pins and the first pair of receiving pins are normal, when the third feedback signal is different from the second test signal, it is determined that the first pair of transmitting pins and the first pair of receiving pins are abnormal, when the fourth feedback signal is the same as the second test signal, it is determined that the second pair of transmitting pins and the second pair of receiving pins are normal, and when the fourth feedback signal is different from the second test signal, it is determined that the second pair of transmitting pins and the second pair of receiving pins are abnormal.

10. The test cable according to claim 6, wherein the first pair of data pins and the second pair of data pins are respectively a USB 2.0 data interface, the first pair of transmitting pins, the second pair of transmitting pins, the first pair of receiving pins and the second pair of receiving pins respectively correspond to a USB 3.0 data interface.

11. The test cable according to claim 1, wherein the test terminal connector is a pogo-pin type connector.

12. The test cable according to claim 1, wherein the test terminal connector further comprises a switch power pin, the switch circuit is coupled to the switch power pin to receive an operation voltage.

13. The test cable according to claim 1, wherein the USB connector further has a first pair of transmitting pins, a second pair of transmitting pins, a first pair of receiving pins and a second pair of receiving pins, the test terminal connector further has a first pair of transmitting test pins, a second pair of transmitting test pins, a first pair of receiving test pins and a second pair of receiving test pins, wherein the first pair of transmitting pins is directly coupled to the first pair of transmitting test pins, the second pair of transmitting pins is directly coupled to the second pair of transmitting test pins, the first pair of receiving pins is directly coupled to the first pair of receiving test pins, and the second pair of receiving pins are directly coupled to the second pair of receiving test pins.

14. The test cable according to claim 13, wherein in a third test phase, the electronic device provides a second test signal transmitted to the test fixture thorough the first pair of transmitting pins and the first pair of transmitting test pins, and the electronic device receives a third feedback signal outputted by the test fixture in corresponding to the second test signal through the first pair of receiving pins and the first pair of receiving test pins, the second test signal and the third feedback signal are compared to determine whether they are the same or different, thereby determining whether the first pair of transmitting pins and the first pair of reeving pins are normal, in a fourth test phase, the electronic device provides the second test signal transmitted to the test fixture through the second pair of transmitting pins and the second pair of transmitting test pins, and the electronic device receives a fourth feedback signal outputted by the test fixture in corresponding to the second test signal through the second pair of receiving pins and the second pair of receiving test pins, the second test signal and the fourth feedback signal are compared to determine whether they are the same or different, thereby determining whether the second pair of transmitting pins and the second pair of receiving pins are normal.

15. The test cable according to claim 14, wherein when the third feedback signal is the same as the second test signal, it is determined that the first pair of transmitting pins and the first pair of receiving pins are normal, when the third feedback signal is different from the second test signal, it is determined that the first pair of transmitting pins and the first pair of receiving pins are abnormal, when the fourth feedback signal is the same as the second test signal, it is determined that the second pair of transmitting pins and the second pair of receiving pins are normal, and when the fourth feedback signal is different from the second test signal, it is determined that the second pair of transmitting pins and the second pair of receiving pins are abnormal.

16. The test cable according to claim 13, wherein the first pair of data pins and the second pair of data pins are respectively a USB 2.0 data interface, the first pair of transmitting pins, the second pair of transmitting pins, the first pair of receiving pins and the second pair of receiving pins respectively correspond to a USB 3.0 data interface.

17. A test method, comprising:
coupling a test fixture and an electronic device through the test cable claimed in claim 1;
in a first test phase, coupling the pair of test data pins to the first pair of data pins according to the first control signal, wherein the electronic device provides a first test signal transmitted to the test fixture through the first pair of data pins and the pair of test data pins of the test cable, and receives a first feedback signal outputted by the test fixture in corresponding to the first test signal thorough the first pair of data pins and the pair of test data pins, the first test signal and the first feedback signal are compared to determine whether they are the same or different, thereby determining whether the first pair of data pins is normal; and
in a second test phase, setting the first control signal to couple the pair of test data pins to the second pair of data pins, wherein the electronic device provides the first test signal transmitted to the test fixture through the second pair of data pins and the pair of test data pins of the test cable, and receives a second feedback signal outputted by the test fixture in corresponding to the first test signal through the second pair of data pins and the pair of test data pins, the first test signal and the second feedback signal are compared to determine whether they are the same or different, thereby determining whether the second pair of data pins is normal.

18. The test method according to claim 17, further comprising:
when it is determined that the first pair of data pins is normal, the electronic device provides a first switching signal transmitted to the test fixture through the first pair of data pins to set the first control signal.

19. The test method according to claim 17, wherein the first pair of data pins and the second pair of data pins are respectively a USB 2.0 data interface.

20. The test method according to claim 17, further comprising:
when the first feedback signal is the same as the first test signal, determining that the first pair of data pins is normal;
when the first feedback signal is different from the first test signal, determining that the first pair of data pins is abnormal;
when the second feedback signal is the same as the first test signal, determining that the second pair of data pins is normal; and
when the second feedback signal is different from the first test signal, determining that the second pair of data pins is abnormal.

21. The test method according to claim 17, wherein the USB connector further has a first pair of transmitting pins, a second pair of transmitting pins, a first pair of receiving pins and a second pair of receiving pins, the test terminal connector further has a pair of transmitting test pins, a pair of receiving test pins and a second control pin, the switch circuit is further coupled to the first pair of transmitting pins, the second pair of transmitting pins, the first pair of receiving pins and the second pair of receiving pins, the pair of transmitting test pins, the pair of receiving test pins and the second control pin, the test fixture is configured to output a second control signal to the second control pin, the test method further comprises:
in a third test phase, the pair of transmitting test pins is coupled to the first pair of transmitting pins according to the second control signal and the pair of receiving test pins is simultaneously coupled to the first pair of reeving pins, the electronic device provides a second test signal transmitted to the test fixture through the first pair of transmitting pins and the pair of transmitting test pins of the test cable, and receives a third feedback signal output by the test fixture in corresponding to the second test signal through the first pair of receiving pins and the pair of receiving test pins, the second test signal and the third feedback signal are compared to determine whether they are the same or different, thereby determining whether the first pair of transmitting pins and the first pair of receiving pins are normal; and in a fourth test phase, the second control signal is set to couple the pair of transmitting test pins to the second pair of transmitting pins and the pair of receiving test pins is simultaneously coupled to the second pair of receiving pins, the electronic device provides the second test signal transmitted to the test fixture through the second pair of transmitting pins and the pair of transmitting test pins of the test cable, and receives a fourth feedback signal output by the test fixture in corresponding to the second test signal though the second pair of receiving pins and the pair of receiving test pins, the second test signal and the fourth feedback signal are compared to determine whether they are the same or different, thereby determining whether the second pair of transmitting pins and the second pair of receiving pins are normal.

22. The test method according to claim 21, further comprising:

when it is determined that the first pair of transmitting pins and the first pair of receiving pins are normal, the electronic device provides a second switching signal transmitted to the test fixture thorough the first pair of transmitting pins to set the second control signal.

23. The test method according to claim 21, wherein the first pair of data pins and the second pair of data pins are respectively a USB 2.0 data interface, the first pair of transmitting pins, the second pair of transmitting pins, the first pair of receiving pins and the second pair of receiving pins respectively correspond to a USB 3.0 data interface.

24. The test method according to claim 21, further comprising:

when the third feedback signal is the same as the second test single, determining that the first pair of transmitting pins and the first pair of receiving pins are normal;

when the third feedback signal is different from the second test signal, determining that the first pair of transmitting pins and the first pair of receiving pins are abnormal;

when the fourth feedback signal is the same as the second test signal, determining that the second pair of transmitting pins and the second pair of receiving pins are normal; and when the fourth feedback signal is different from the second test signal, determining that the second pair of transmitting pins and the second pair of receiving pins are abnormal.

25. The test method according to claim 21, wherein the third test phase and the fourth test phase are prior to the first test phase and the second test phase.

26. The test method according to claim 17, wherein the USB connector further has a first pair of transmitting pins, a second pair of transmitting pins, a first pair of receiving pins and a second pair of receiving pins, the test terminal connector further has a first pair of transmitting test pins, a second pair of transmitting test pins, a first pair of receiving test pins and a second pair of receiving test pins, wherein the first pair of transmitting pins is directly coupled to the first pair of transmitting test pins, the second pair of transmitting pins is directly coupled to the second pair of transmitting test pins, the first pair of receiving pins is directly coupled to the first pair of receiving test pins, and the second pair of receiving pins is directly coupled to the second pair of receiving test pins, the test method further comprises:

in a third test phase, the electronic device provides a second test signal transmitted to the test fixture through the first pair of transmitting pins and the first pair of transmitting test pins of the test cable, and receives a third feedback signal outputted by the test fixture in corresponding to the second test signal through the first pair of receiving pins and the first pair of receiving test pins, the second test signal and the third feedback signal are compared to determine whether they are the same or different, thereby determining whether the first pair of transmitting pins and the first pair of receiving pins are normal; and in a fourth test phase, the electronic device provides the second test signal transmitted to the test fixture thorough the second pair of transmitting pins and the second pair of transmitting test pins of the test cable, and receives a fourth feedback signal outputted by the test fixture in corresponding to the second test signal through the second pair of receiving pins and the second pair of receiving test pins, the second test signal and the fourth feedback signal are compared to determine whether they are the same or different, thereby determining whether the second pair of transmitting pins and the second pair of receiving pins are normal.

27. The test method according to claim 26, wherein the first pair of data pins and the second pair of data pins are respectively a USB 2.0 data interface, the first pair of transmitting pins, the second pair of transmitting pins, the first pair of receiving pins and the second pair of receiving pins respectively correspond to a USB 3.0 data interface.

28. The test method according to claim 26, further comprising:

when the third feedback signal is the same as the second test single, determining that the first pair of transmitting pins and the first pair of receiving pins are normal;

when the third feedback signal is different from the second test signal, determining that the first pair of transmitting pins and the first pair of receiving pins are abnormal;

when the fourth feedback signal is the same as the second test signal, determining that the second pair of transmitting pins and the second pair of receiving pins are normal; and when the fourth feedback signal is different from the second test signal, determining that the second pair of transmitting pins and the second pair of receiving pins are abnormal.

29. The test method according to claim 26, wherein the third test phase and the fourth test phase are prior to the first test phase and the second test phase.

* * * * *